（12）United States Patent
Liu

(10) Patent No.: US 12,457,729 B2
(45) Date of Patent: Oct. 28, 2025

(54) METHOD FOR FORMING CAPACITOR OPENING HOLE AND METHOD FOR FORMING MEMORY CAPACITOR

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 985 days.

(21) Appl. No.: 17/379,064

(22) Filed: Jul. 19, 2021

(65) Prior Publication Data

US 2021/0358914 A1 Nov. 18, 2021

Related U.S. Application Data

(63) Continuation of application No. PCT/CN2021/075035, filed on Feb. 3, 2021.

(30) Foreign Application Priority Data

May 12, 2020 (CN) .......................... 202010396954.4

(51) Int. Cl.
*H10B 12/00* (2023.01)
*H10D 1/00* (2025.01)
*H10D 1/68* (2025.01)

(52) U.S. Cl.
CPC ............ *H10B 12/03* (2023.02); *H10B 12/033* (2023.02); *H10D 1/042* (2025.01); *H10D 1/043* (2025.01); *H10D 1/696* (2025.01); *H10D 1/716* (2025.01)

(58) Field of Classification Search
CPC ........ H10B 12/033; H10B 12/03; H10D 1/68; H10D 1/716; H10D 1/696; H10D 1/043; H10D 1/042
See application file for complete search history.

(56) References Cited

U.S. PATENT DOCUMENTS 5,476,807 A 12/1995 Lee
8,115,277 B2 2/2012 Von Kluge
(Continued)

FOREIGN PATENT DOCUMENTS

CN 107895721 A 4/2018
CN 108447864 A 8/2018
(Continued)

OTHER PUBLICATIONS

Supplementary European Search Report cited in EP21803389.2, mailed on Jan. 30, 2023, 7 pages.
(Continued)

*Primary Examiner* — Brigitte A Paterson
(74) *Attorney, Agent, or Firm* — SYNCODA LLC; Feng Ma

(57) ABSTRACT

A method for forming a capacitor opening hole and a method for forming a memory capacitor are provided. The method for forming a capacitor opening hole includes: providing a substrate, and forming a sacrificial layer and a supporting layer, which are stacked, on the surface of the substrate (S100); forming multiple hollow first side wall structures, spaced apart, on the surface of the supporting layer (S200); forming a second material layer on the surface of the first side wall structure to constitute a second side wall structure (S300); and etching the sacrificial layer and the supporting layer by taking the first side wall structure and the second side wall structure as masks to form the capacitor opening hole (S400).

20 Claims, 18 Drawing Sheets

(56) References Cited

U.S. PATENT DOCUMENTS

| | | | |
|---|---|---|---|
| 2005/0051822 A1* | 3/2005 | Manning | H10B 12/318 |
| | | | 438/254 |
| 2005/0176210 A1 | 8/2005 | Kim | |
| 2006/0014385 A1* | 1/2006 | Kim | C23C 16/34 |
| | | | 257/E21.648 |
| 2006/0211178 A1 | 9/2006 | Kim | |
| 2018/0061840 A1* | 3/2018 | Sills | H01L 21/76897 |

FOREIGN PATENT DOCUMENTS

| | | |
|---|---|---|
| CN | 108538835 A | 9/2018 |
| CN | 108987346 A | 12/2018 |
| CN | 208521929 U | 2/2019 |
| CN | 110943163 A | 3/2020 |

OTHER PUBLICATIONS

Written Opinion cited in PCT/CN2021/075035, mailed on May 8, 2021, 7 pages.
International Search Report in the international application No. PCT/CN2021/075035, mailed on May 8, 2021, 2 pgs.

* cited by examiner

METHOD FOR FORMING CAPACITOR OPENING HOLE AND METHOD FOR FORMING MEMORY CAPACITOR

CROSS-REFERENCE TO RELATED APPLICATION

The present application is a U.S. continuation application of International Application No. PCT/CN2021/075035, filed on Feb. 3, 2021, which claims priority to Chinese Patent Application No. 202010396954.4, filed on May 12, 2020. International Application No. PCT/CN2021/075035 and Chinese Patent Application No. 202010396954.4 are incorporated herein by reference in their entireties.

TECHNICAL FIELD

The disclosure relates to the field of semiconductors, and in particular to a method for forming a capacitor opening hole and a method for forming a memory capacitor.

BACKGROUND

With the development of science and technology, people have higher demands for a semiconductor technology. With the continuous reduction of the area of semiconductor devices, there is a higher requirement for the precision and accuracy of a semiconductor manufacturing process. A semiconductor memory is a memory accessed by using a semiconductor circuit. Dynamic Random Access Memory (DRAM) is widely used in various fields due to its high storage speed and highly integrated level.

When forming a memory capacitor of the DRAM, a sacrificial layer needs to be formed on the surface of a substrate to serve as a supporting structure of a capacitor hole. After forming one electrode of the capacitor, the sacrificial layer is removed and the remaining capacitor structure is formed. Therefore, a capacitor opening hole is needed for the connection of the capacitor hole so that the sacrificial layer is exposed to an etching environment, thereby removing the sacrificial layer. However, with the continuous reduction of the size of the DRAM and the increasing improvement of the integrated level, the size of the capacitor opening hole is also continuously miniaturized. The existing preparation technologies cannot meet the rapidly developing requirements for the size and precision of a capacitor opening hole.

SUMMARY

According to various examples of the disclosure, a method for forming a capacitor opening hole and a method for forming a memory capacitor are provided.

A method for forming a capacitor opening hole includes the following acts.

A substrate is provided, and a sacrificial layer and a supporting layer, which are stacked, are formed on the surface of the substrate.

Multiple hollow first side wall structures, spaced apart, are formed on the surface of the supporting layer.

A second material layer is formed on the surface of the first side wall structure to constitute a second side wall structure.

The sacrificial layer and the supporting layer are etched by taking the first side wall structure and the second side wall structure as masks to form the capacitor opening hole.

A method for forming a memory capacitor includes the following acts.

A substrate is provided, and a sacrificial layer and a supporting layer, which are stacked, are formed on the surface of the substrate.

The sacrificial layer and the supporting layer are etched to the surface of the substrate according to a capacitor hole layout to form a capacitor hole.

A first electrode layer is formed in the capacitor hole, and the first electrode layer covers an inner wall of the capacitor hole and the exposed substrate.

A capacitor opening hole is formed by using the foregoing method for forming, and the capacitor opening hole is used to connect multiple adjacent capacitor holes.

The remaining sacrificial layer is etched through the capacitor opening hole.

A capacitor dielectric layer and a second electrode layer are sequentially formed on an inner wall of the capacitor opening hole and the surface of the first electrode layer. The first electrode layer, the capacitor dielectric layer and the second electrode layer jointly constitute the memory capacitor.

Details of one or more examples of the disclosure are proposed in the following drawings and descriptions. Other features, objectives, and advantages of the disclosure will become apparent from the specification, the drawings, and the claims.

BRIEF DESCRIPTION OF THE DRAWINGS

For a better description and illustration of the examples of the disclosure, reference can be made to one or more of the drawings. However, additional details or examples for describing the drawings should not be construed as limiting the scope of any one of the creation, presently described examples, or preferred modes of the disclosure.

DESCRIPTIONS OF NUMERALS OF ELEMENTS

Figure 1:
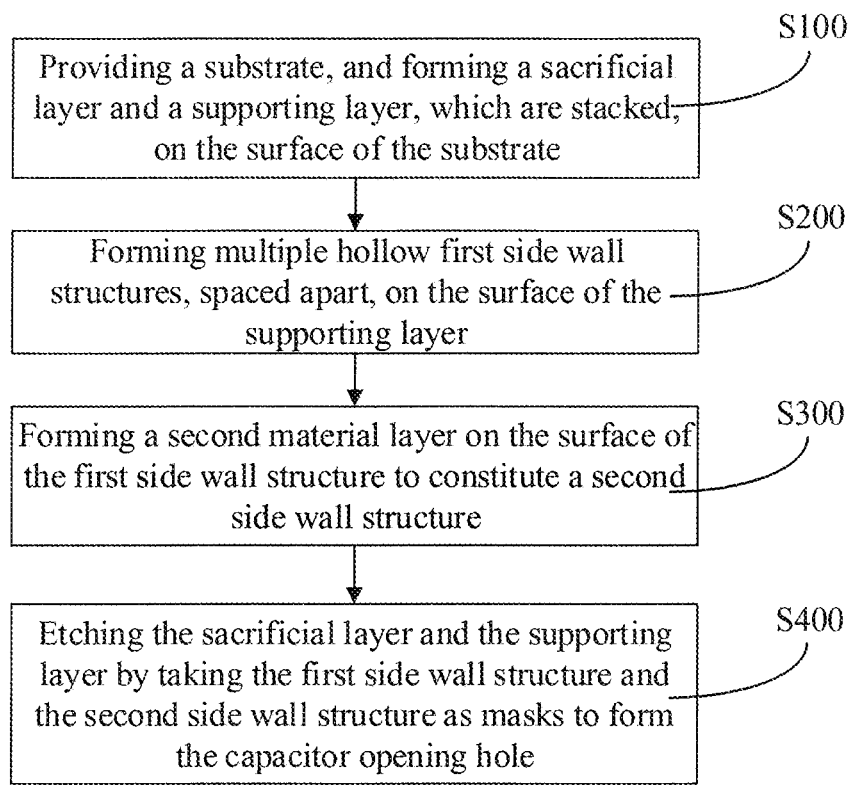
FIG. 1 is a flow chart of a method for forming a capacitor opening hole according to one or more examples.

101: contact pad; 110: sacrificial layer; 120: supporting layer; 200: capacitor hole; 300: capacitor opening hole; 310: first side wall structure; 320: second side wall structure; 330: initial side wall structure; 331: first initial side wall; 332: second initial side wall; 341: first etching pattern; 342: second etching pattern; 400: first electrode layer; 500: capacitor dielectric layer; 600: second electrode layer

DETAILED DESCRIPTION

For convenience of an understanding of the disclosure, the disclosure will now be described more comprehensively hereinafter with reference to the related drawings. The examples of the disclosure are illustrated in the drawings. The disclosure may, however, be achieved in many different forms which are not limited to the examples described herein. Rather, these examples are provided so that the disclosure of the disclosure will be thorough and comprehensive.

Unless defined otherwise, all technical and scientific terms used herein have the same meaning as commonly understood by those skilled in the art to which the disclosure belongs. The terms used herein in the specification of the disclosure is for the purpose of describing specific examples only and is not intended to limit of the disclosure.

It should be understood that when an element or layer is described as being "on", "adjacent to", "connected to", or "coupled to" another element or layer, it may be directly on, adjacent to, connected to, or coupled to other element or layer, or intervening elements or layers may be present. In contrast, when an element is described as being "directly on", "directly adjacent to", "directly connected to", or "directly coupled to" another element or layer, no intervening elements or layers are present. It should be understood that although the terms first, second, third, etc. may be used to describe various elements, components, regions, layers, doping types, and/or portions, these elements, components, regions, layers, doping types, and/or portions should not be limited by these terms. These terms are only used to distinguish one element, component, region, layer, doping type, or portion from another element, component, region, layer, doping type, or portion. Therefore, a first element, component, region, layer, doping type, or portion discussed below may be represented as a second element, component, region, layer, or portion without departing from the teachings of the disclosure.

Spatial relationship terms such as "beneath", "below", "lower", "under", "above", or "upper" may be used herein to describe a relationship between one element or feature and other element or feature shown in the figures. It should be understood that in addition to the orientations shown in the figures, the spatial relationship terms further include different orientations of devices in use and operation. For example, if the devices in the figures are turned over, an element or feature described as being "below" or "under" or "beneath" other element will be oriented as being "on" other element or feature. Therefore, the exemplary terms "below" and "under" may include both up and down orientations. In addition, the devices may also include additional orientations (e.g., rotation for 90 degrees or other orientations), and the spatial descriptors used herein are interpreted accordingly.

As used herein, the singular forms "a", "an", and "the" may include the plural forms as well, unless the context clearly dictates otherwise. It should also be understood that the terms "comprising/including" or "having", etc. specify the presence of a stated feature, integer, step, operation, component, portion, or combination thereof, but do not preclude the possibility of the presence or addition of one or more other features, integers, steps, operations, components, portions, or combinations thereof. Also, in the present specification, the term "and/or" includes any and all combinations of the associated listed items.

The examples of the disclosure are described herein with reference to cross-sectional views that are schematic views of ideal examples (and intermediate structures) of the disclosure, such that variations in the shown shapes due to, for example, manufacturing technologies and/or tolerances may be expected. Therefore, the examples of the disclosure should not be limited to the particular shapes of regions shown herein, but include shape variations due to, for example, manufacturing technologies. For example, injection regions shown as rectangles typically have rounded or curved features and/or injection concentration gradients at their edges rather than binary changes from injection regions to non-injection regions. Also, a buried region formed by injection may result in some injections in a region between the buried region and the surface through which the injection is performed. Therefore, the regions shown in the figures are schematic substantially and their shapes do not represent actual shapes of the regions of the devices and does not limit the scope of the disclosure.

FIG. 1 is a flow chart of a method for forming a capacitor opening hole according to one or more examples. As shown in FIG. 1, in the present example, the method for forming a capacitor opening hole includes S100 to S400.

At S100, a substrate is provided, and a sacrificial layer 110 and a supporting layer 120, which are stacked, are formed on the surface of the substrate.

Specifically, multiple active regions and isolation structures are formed in the substrate, the multiple active regions are arranged in an array mode, and the isolation structures are arranged between the adjacent active regions. In each active region, at least one transistor and a word line structure penetrating through the active region are formed, and a bit line structure is formed on the surface of the active region. A grid electrode of each transistor is electrically connected to the word line structure, a drain electrode is electrically connected to the bit line structure, and a source electrode is electrically connected to a first electrode layer 400 of a memory capacitor so as to access data to the memory capacitor.

Figure 2:
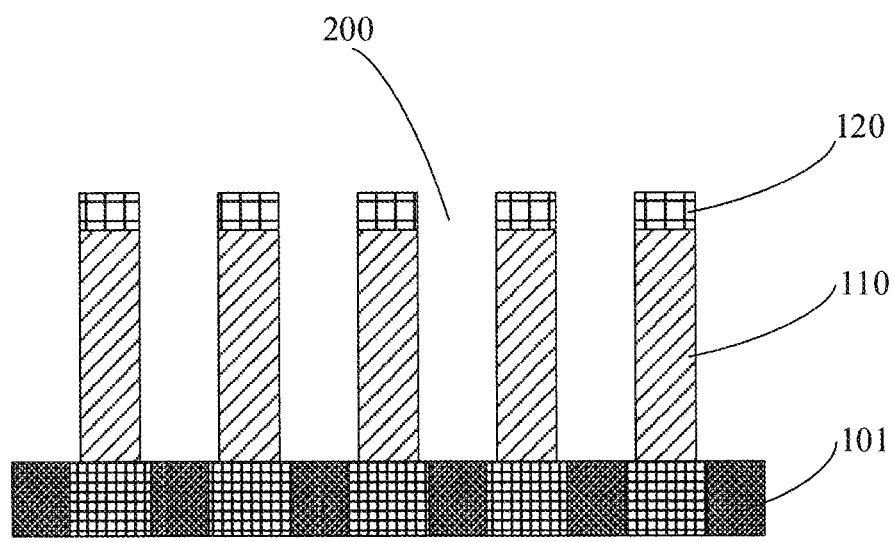
FIG. 2 is a schematic cross-sectional view of a substrate having been formed with a sacrificial layer and a supporting layer according to one or more examples.
Figure 3:
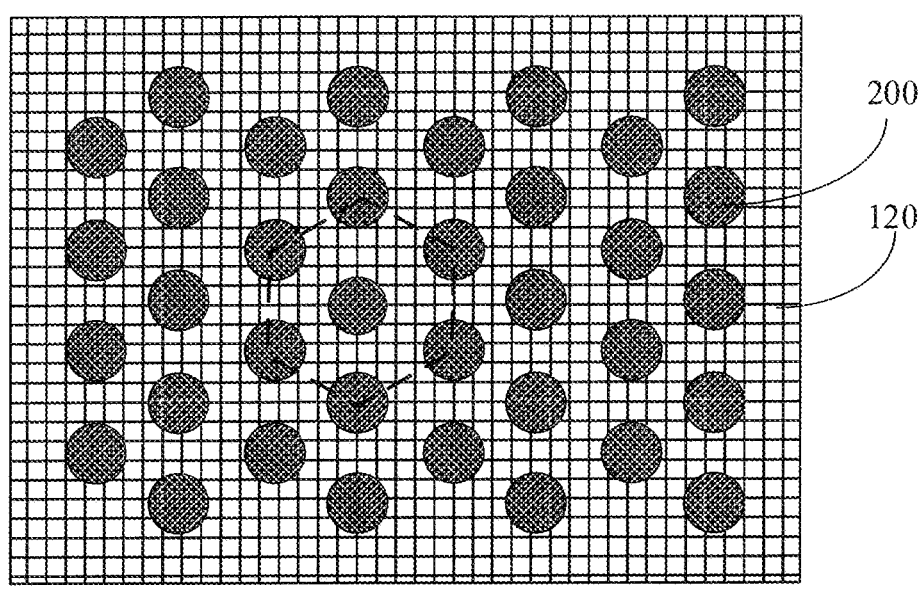
FIG. 3 is a schematic top view of a device structure according to the example shown in FIG. 2.

FIG. 2 is a schematic cross-sectional view of a substrate having been formed with a sacrificial layer 110 and a supporting layer 120 according to an example. As shown in FIG. 2, multiple contact pads 101 are further formed in the substrate, the multiple contact pads 101 are regularly arranged in a horizontal plane, and each contact pad 101 corresponds to one capacitor hole 200. FIG. 3 is a schematic top view of a device structure according to the example shown in FIG. 2. As shown in FIGS. 2 to 3, in the present example, multiple capacitor holes 200 are formed in the sacrificial layer 110 and the supporting layer 120, the capacitor holes 200 penetrate through the sacrificial layer 110 and the supporting layer 120 to the surface of the substrate in a vertical direction, six adjacent capacitor holes 200 are arranged in a horizontal plane in the shape of a regular hexagon, each vertex of the regular hexagon is provided with one capacitor hole 200, and the center of the regular hexagon is provided with one capacitor hole 200. In the present example, the capacitor holes 200 are arranged in a Hexagonal Closest Packed (HCP) structure. Based on the HCP structure, closely arranged memory capacitors may be formed in subsequent steps, so that the arrangement density and the integration level of the memory capacitors in a DRAM are improved.

It should be noted that the arrangement of six adjacent capacitor holes 200 in a horizontal plane in the shape of a regular hexagon means that the center points of each capacitor hole 200 constitute a virtual regular hexagon in the horizontal plane as shown in FIG. 3. In other examples, the definition of the arrangement in a horizontal plane in the shape of a regular hexagon is the same as that in the present example, and descriptions are omitted herein.

Further, an insulated layer is formed between the adjacent contact pads 101 to isolate the different contact pads 101, thereby preventing a short circuit phenomenon from occurring between the different contact pads 101 to improve the reliability of the DRAM. Optionally, the material of the contact pad 101 may be one or more of tungsten, aluminum, copper, titanium, tantalum, or polysilicon. The material of the insulated layer may be one or more of silicon nitride (SiN), silicon oxide ($SiO_2$), or aluminum oxide ($Al_2O_3$). The material of the sacrificial layer 110 may be one or more of silicon dioxide ($SiO_2$), phosphosilicate glass (PSG), tetraethylorthosilicate (TEOS), borophosphosilicate glass (BPSG), or fluosilicate glass (FSG). The material of the supporting layer 120 may be, but is not limited to, silicon nitride ($Si_3N_4$).

At S200, multiple hollow first side wall structures 310, spaced apart, are formed on the surface of the supporting layer 120.

Figure 4:
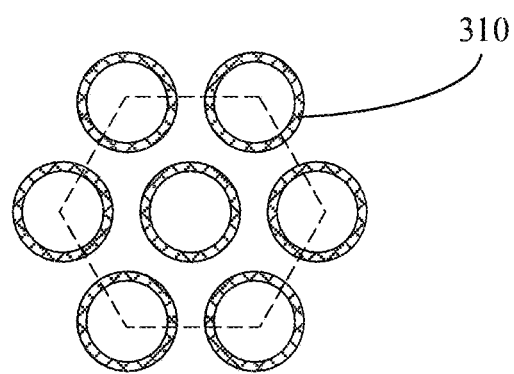
FIG. 4 is a schematic top view of a first side wall structure according to one or more examples.

Specifically, FIG. 4 is a schematic top view of a first side wall structure 310 according to an example. As shown in FIG. 4, in the present example, the first side wall structure 310 is a hollow columnar, and multiple first side wall structures 310 are arranged in an array, where the hollow columnar may be a hollow cylinder, a quadrangular prism, a hexagonal prism, an octagonal prism, etc. The specific shape of the columnar is not limited in the present example. It should be noted that only the first side wall structure 310 is shown in FIG. 4, and structures such as the supporting layer 120 and the capacitor hole 200 located on the lower side of the first side wall structure 310 are not shown.

Further, since the size of the first side wall structure 310 is small, an optical proximity effect may exist during an exposure process, thereby causing a pattern formed after the exposure to be incompletely matched with a layout pattern. Therefore, the shape of the first side wall structure 310 may be appropriately adjusted during layout design to obtain a better device structure and device performance, i.e., the first side wall structure 310 may not be limited to the foregoing regular columnar structure. Moreover, in the design layouts for other structures in other examples, the layout pattern may be appropriately adjusted to achieve a better device structure and device performance. Descriptions will be omitted in other examples.

Furthermore, with continued reference to FIG. 4, six adjacent first side wall structures 310 are arranged in the horizontal plane in the shape of a regular hexagon, each vertex of the regular hexagon is provided with one first side wall structure 310, and the center of the regular hexagon is provided with one first side wall structure 310. Moreover, the first side wall structure 310 and the capacitor hole 200 are matched in size, i.e., as the size of the capacitor hole 200 and the distance between adjacent capacitor holes 200 are larger, the size of the first side wall structure 310 and the distance between adjacent first side wall structures 310 are larger accordingly, so that a capacitor opening hole 300 can effectively connect the corresponding multiple capacitor holes 200.

At S300, a second material layer is formed on the surface of the first side wall structure 310 to form a second side wall structure 320.

Figure 5:
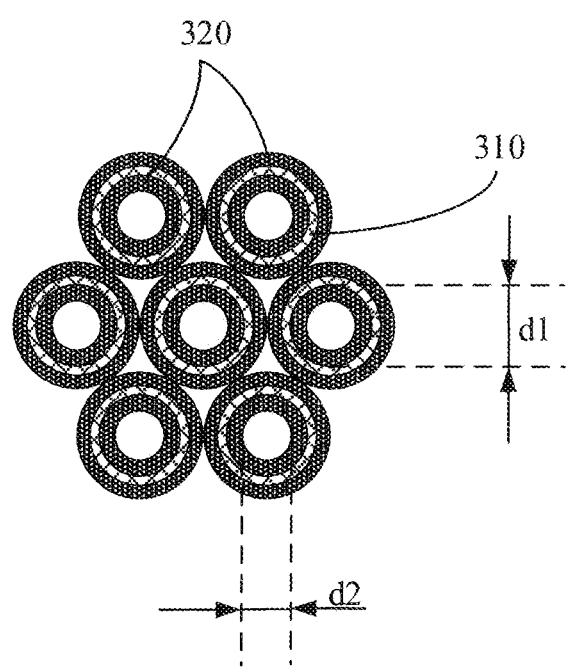
FIG. 5 is a schematic top view of a first side wall structure and a second side wall structure after S300 according to one or more examples.

FIG. 5 is a schematic top view of a first side wall structure 310 and a second side wall structure 320 after S300 according to an example. As shown in FIG. 5, in the present example, a second material layer covers inner and outer sidewalls of the first side wall structure 310. In other examples, the second material layer may cover the top of the first side wall structure 310.

In the present example, in a vertical direction, a region where the supporting layer 120 and the sacrificial layer 110 are not covered by the first side wall structure 310 and the second side wall structure 320 is a region where the capacitor opening hole 300 is formed in subsequent steps, and the forming method of the present example can effectively improve the preparation precision of the capacitor opening hole 300. Specifically, with continued reference to FIG. 5, the first side wall structure 310 is, for example, a hollow cylinder. Assuming that the first side wall structure 310 is formed with a minimum process size d1 of an exposure process, the diameter of an inner contour of the first side wall structure 310 is d1. If the capacitor opening hole 300 is formed based on the first side wall structure 310, the diameter of the capacitor opening hole 300 is also d1. In the present example, a second side wall structure 320 of which the diameter of an inner contour is d2 may be obtained by S300, where d2<d1, so that the capacitor opening hole 300 with a smaller size is prepared. The preparation precision of the capacitor opening hole 300 is improved, and the preparation yield of the capacitor opening hole 300 is also improved.

At S400, the sacrificial layer 110 and the supporting layer 120 are etched by taking the first side wall structure 310 and the second side wall structure 320 as masks to form a capacitor opening hole 300.

Specifically, in the present example, the sacrificial layer 110 and the supporting layer 120 may be removed by using a dry etching process, an etching gas may be a mixture of carbon tetrafluoride and trichloromethane, and the supporting layer 120 and the sacrificial layer 110 may be etched based on an etching selection ratio of the supporting layer 120 to the sacrificial layer 110 by setting different etching gas ratios. In other examples, the supporting layer 120 may be removed by using a dry etching process, and the sacrificial layer 110 may be removed by using a wet etching process. It can be understood that the operation of the wet etching process is simpler without regard to an etching selection ratio of the supporting layer 120 to the sacrificial layer 110, but increases the number of steps of the process, thereby prolonging the preparation cycle. Therefore, a more appropriate etching process may be selected according to actual preparation requirements.

According to the method for forming a capacitor opening hole in the present example, the first side wall structure 310 and the second side wall structure 320 which are closely arranged may be formed through S100 to S400 to further form the capacitor opening hole 300. Based on the forming method of the closely arranged double side wall structures, the connection effect of the capacitor opening hole 300 can be achieved, and the capacitor opening hole 300 of a smaller volume can be prepared, so that the preparation precision of the capacitor opening hole 300 is improved.

Figure 6:
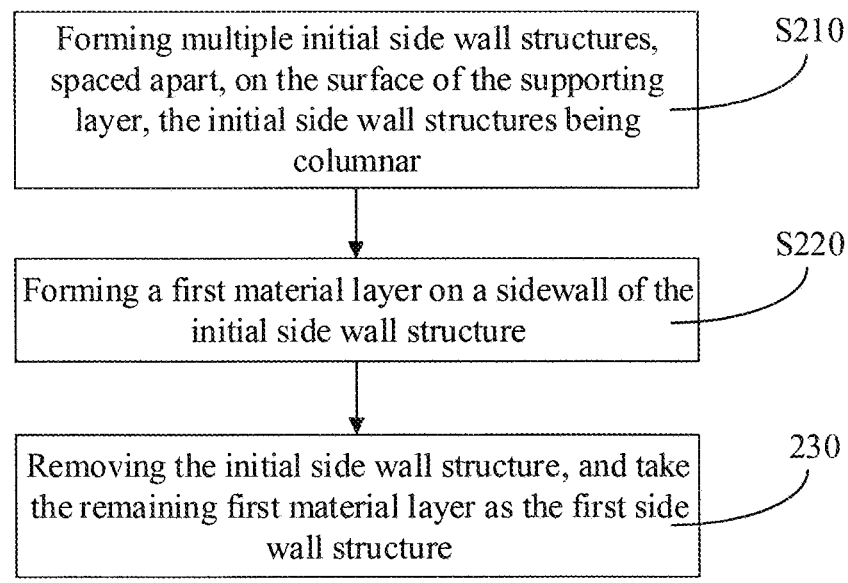
FIG. 6 is a sub-flow chart of S200 according to one or more examples.

FIG. 6 is a sub-flow chart of S200 according to an example. As shown in FIG. 6, in the present example, S200 includes S210 to S230.

At S210, multiple initial side wall structures 330, spaced apart, are formed on the surface of the supporting layer 120, and the initial side wall structures 330 are columnar.

Figure 7:
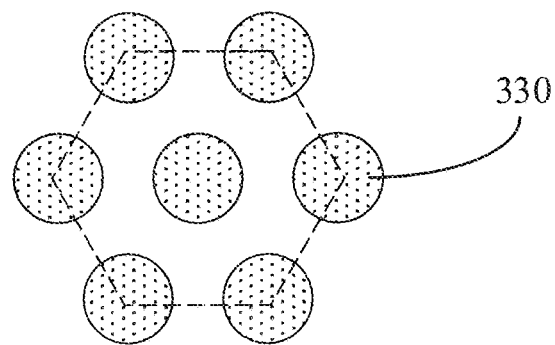
FIG. 7 is a schematic top view of initial side wall structures after S210 according to one or more examples.

Specifically, FIG. 7 is a schematic top view of initial side wall structures 330 after S210 according to an example. The columnar initial side wall structure 330 may be a cylinder, a quadrangular prism, a hexagonal prism, an octagonal prism, etc. The initial side wall structure 330 serves as a supporting structure to form the first side wall structure 310 in subsequent steps. Further, as shown in FIG. 7, six adjacent initial side wall structures 330 are arranged in a horizontal plane in the shape of a regular hexagon, each vertex of the regular hexagon is provided with one initial side wall structure 330, and the center of the regular hexagon is provided with one initial side wall structure 330.

In an example, the initial side wall structure 330 is a photoresist material, and the initial side wall structure 330 is formed by the following steps: forming a first photoresist layer on the surface of the supporting layer 120; exposing and developing the first photoresist layer through a photomask of the initial side wall structure; and taking the remaining first photoresist layer as the initial side wall structure 330. The preparation process of the initial side wall structure 330 formed by the method of the present example is simple, and the preparation period can be effectively shortened.

In another example, the initial side wall structure 330 is a silicon compound doped with elements such as carbon, nitrogen and oxygen, and the initial side wall structure 330 is formed by the following steps: sequentially forming an initial side wall material layer and a second photoresist layer on the surface of the supporting layer 120; exposing and developing the second photoresist layer through a photomask of the initial side wall structure to form a patterned second photoresist layer, the patterned second photoresist layer shielding a region where the initial side wall structure 330 is to be formed; and etching the initial side wall material layer by taking the patterned second photoresist layer as a mask, and taking the remaining initial side wall material layer as the initial side wall structure 330. The initial side wall structure 330 formed by the method of the present example is strong and not easily deformed, and therefore, the first side wall structure 310 prepared based on the initial side wall structure 330 has a better shape accuracy. The initial side wall structure 330 and the first side wall structure 310 have a greater etching selection ratio.

At S220, a first material layer is formed on a sidewall of the initial side wall structure 330.

Figure 8:
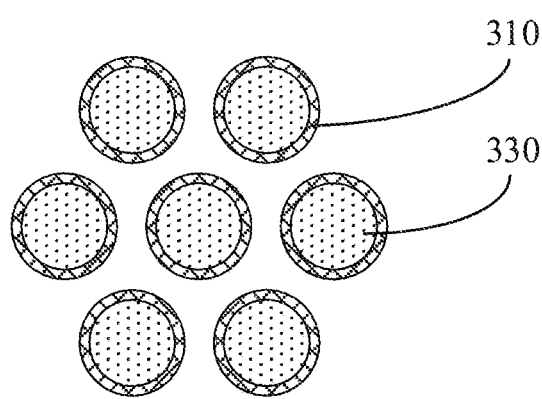
FIG. 8 is a schematic top view of initial side wall structures and first material layers after S220 according to one or more examples.

Specifically, FIG. 8 is a schematic top view of initial side wall structures 330 and first material layers after S220 according to an example. As shown in FIG. 8, a first material layer is formed on a sidewall of the initial side wall structure 330. Further, the material of the first material layer may be nitride, such as silicon nitride, and may be formed by one of Physical Vapor Deposition (PVD), Chemical Vapor Deposition (CVD), Plasma Enhanced Chemical Vapor Deposition (PECVD), Atomic Layer Deposition (ALD), etc. In the present example, the first material layer needs to expose a portion of the initial side wall structure 330 to facilitate removal of the initial side wall structure 330 in subsequent steps. In the present example, the silicon nitride is strong and thus has good structural stability, so that the second side wall structure 320 to be subsequently formed can be effectively supported.

At S230, the initial side wall structure 330 is removed, and the remaining first material layer is taken as the first side wall structure 310.

In the present example, multiple first side wall structures 310, spaced apart, as shown in FIG. 4 may be formed through S210 to S230. Further, a deposition thickness of the first side wall structure 310 can be changed accurately and quickly by changing a deposition time of the first material layer without changing a pattern in a photomask, thereby providing a higher preparation flexibility to be compatible with capacitor holes 200 of different sizes or different spacing.

Figure 9:
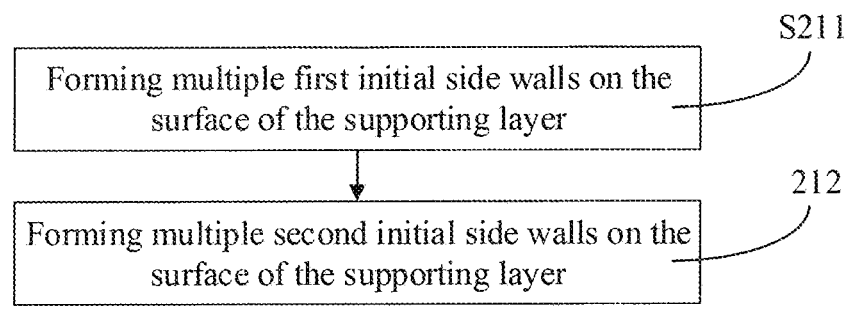
FIG. 9 is a sub-flow chart of S210 according to one or more examples.

FIG. 9 is a sub-flow chart of S210 according to an example. As shown in FIG. 9, in the present example, S210 includes S211 to S212.

At S211, multiple first initial side walls 331 are formed on the surface of the supporting layer 120.

At S212, multiple second initial side walls 332 are formed on the surface of the supporting layer 120.

Figure 10:
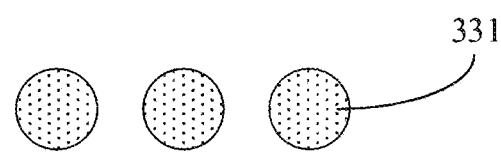
FIG. 10 is a schematic top view of a device structure after S211 according to one or more examples.
Figure 11:
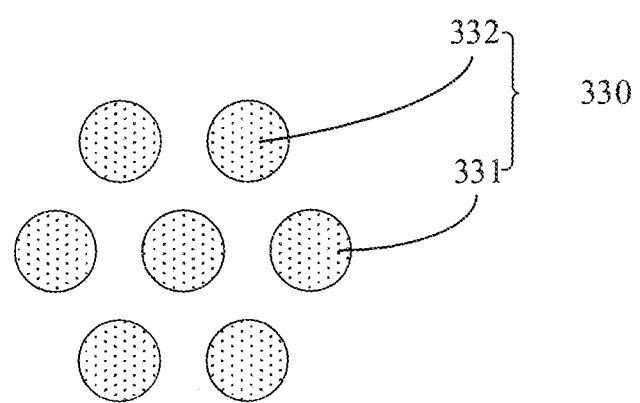
FIG. 11 is a schematic top view of a device structure after S212 according to the example shown in FIG. 10.

The first initial side wall 331 and the second initial side wall 332 have the same shape and are spaced apart from each other, and the multiple first initial side walls 331 and the multiple second initial side walls 332 jointly constitute the initial side wall structures 330. FIG. 10 is a schematic top view of a device structure after S211 according to an example. FIG. 11 is a schematic top view of a device structure after S212 according to the example shown in FIG. 10. As shown in FIGS. 10 to 11, in the present example, the number of initial side wall structures 330 to be formed in each step can be reduced by forming multiple initial side wall structures 330 in batches, thereby reducing the preparation difficulty of the initial side wall structure 330 and improving the preparation yield of the initial side wall structure 330. Further, when the arrangement density of the multiple initial side wall structures 330 is excessively high, the initial side wall structures may be prepared in multiple steps divided, and the dividing manner is not limited to the dividing manner shown in FIGS. 10 to 11.

In an example, S300 includes the following operation. An oxide layer is formed on the surface of the first side wall structure 310 by adopting a growth process to constitute the second side wall structure 320. Specifically, the oxide layer may be a silicon oxide layer. Further, in the present example, the oxide layers are simultaneously grown on inner and outer sidewalls of the first side wall structure 310 through a one-step process. Therefore, the growth time of the second side wall structure 320 can be adjusted according to the size and spacing of capacitor holes 200 to be formed, thereby conveniently adjusting the thickness of the oxide layers to change the size and spacing of the second side wall structure 320.

Figure 12:
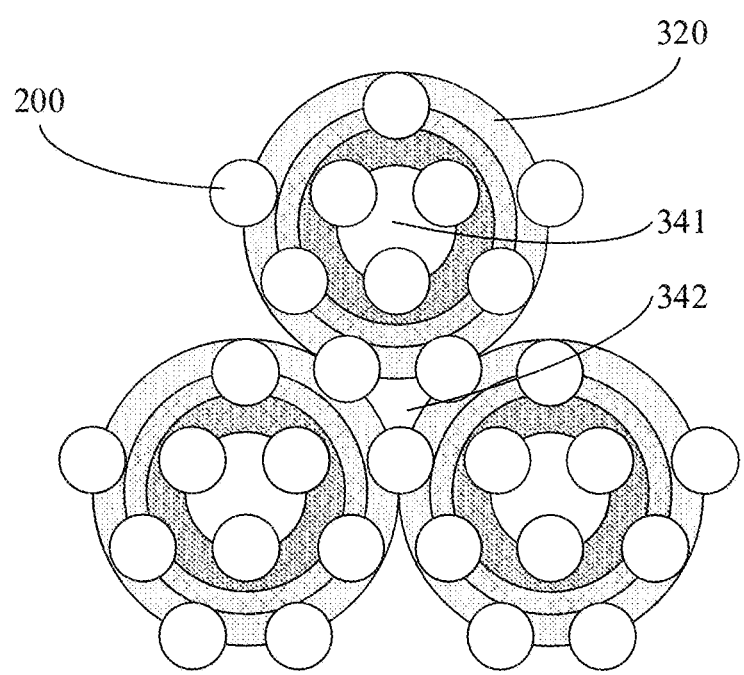
FIG. 12 is a schematic view of a positional relationship between side wall structure and capacitor holes according to one or more examples.

FIG. 12 is a schematic view of a positional relationship between a side wall structure and a capacitor hole 200 according to an example. As shown in FIG. 12, in the present example, outer contours of two adjacent second side wall structures 320 are tangent to reduce the size of the capacitor opening hole 300 on the premise that the multiple capacitor holes 200 are effectively connected, thereby enabling the memory capacitor to obtain a larger charge storage capacity.

Further, as shown in FIG. 12, an inner contour of the second side wall structure 320 constitutes a first etching pattern 341, and the first etching pattern 341 is approximately circular. Outer contours of three adjacent second side wall structures 320 jointly constitute a second etching pattern 342, and the second etching pattern 342 is approximately triangular. The first etching pattern 341 and the second etching pattern 342 correspond to the capacitor opening holes 300 to be formed one by one, each capacitor opening hole 300 is used to connect three adjacent capacitor holes 200, and each capacitor hole 200 is connected to only one capacitor opening hole 300. Based on the arrangement mode of the capacitor opening holes 300 in the present example, the connection efficiency of the capacitor opening holes 300 can be effectively improved.

In an example, after S400, the method further includes the following operation. The first side wall structure 310 and the second side wall structure 320 are removed. By removing the first side wall structure 310 and the second side wall structure 320, it is convenient to continue forming a capacitor dielectric layer 500 and a second electrode layer 600 in subsequent steps.

Figure 13:
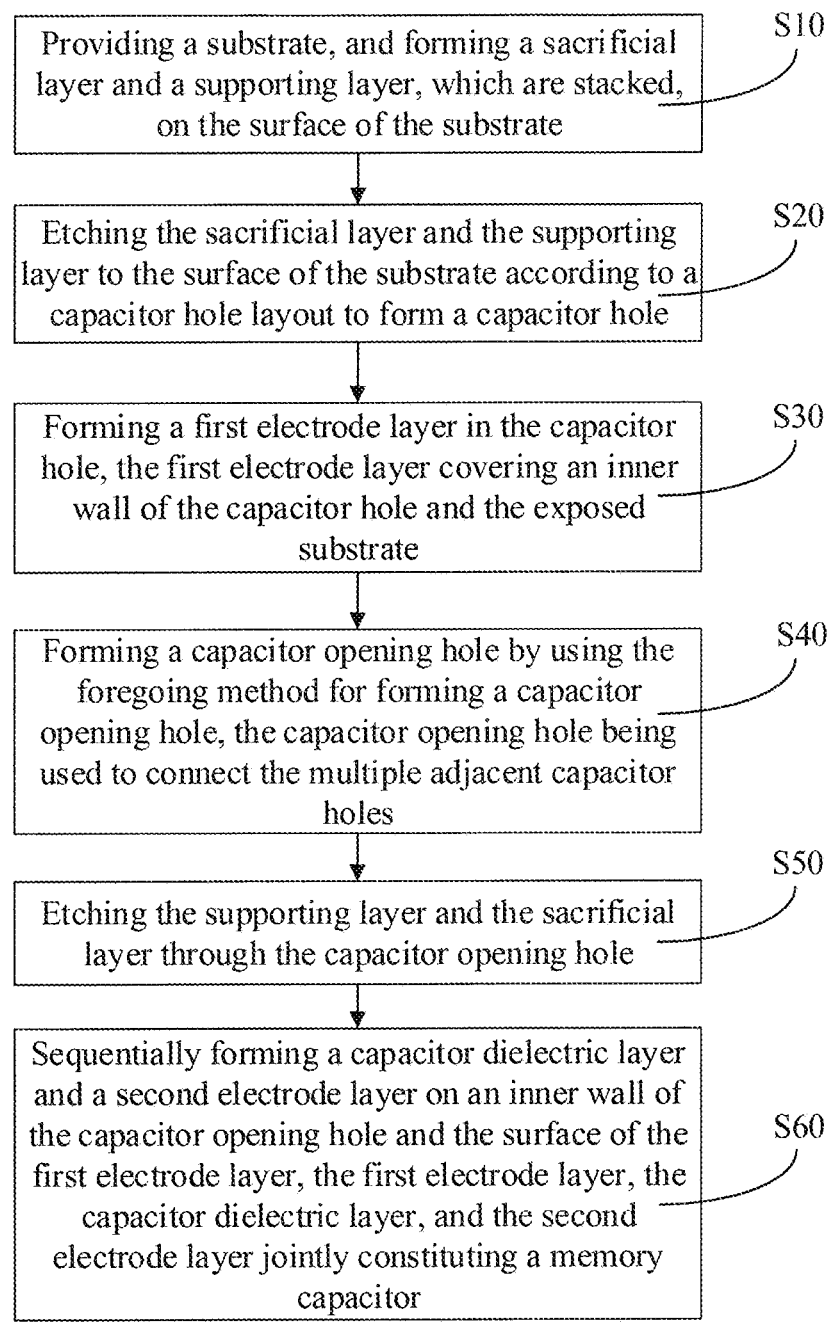
FIG. 13 is a method for forming a memory capacitor according to one or more examples.

FIG. 13 is a method for forming a memory capacitor according to an example. As shown in FIG. 13, in the present example, the method for forming a memory capacitor includes S10 to S60.

At S10, a substrate is provided, and a sacrificial layer 110 and a supporting layer 120, which are stacked, are formed on the surface of the substrate.

Figure 14:
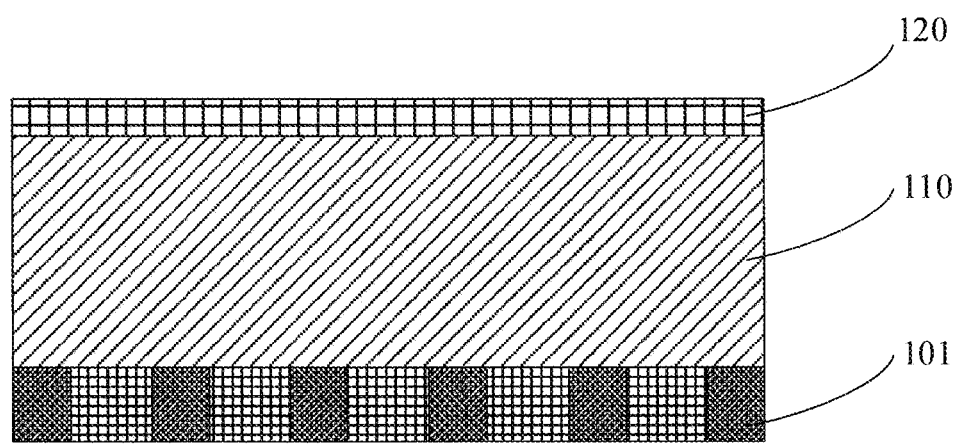
FIG. 14 is a schematic cross-sectional view of a device structure after S10 according to one or more examples.

FIG. 14 is a schematic cross-sectional view of a device structure after S10 in an example. As shown in FIG. 14, in the present example, the sacrificial layer 110 is formed on the surface of the substrate, and the supporting layer 120 is formed on the surface of the sacrificial layer 110. Specifically, the supporting layer 120 is used to enhance the structural strength of the memory capacitor to prevent damage to the structure of the memory capacitor, thereby improving the stability of a device. In the present example, the supporting layer 120 may be formed by using a CVD process, and the material of the supporting layer 120 may be, but is not limited to, silicon nitride ($Si_3N_4$). The material of the sacrificial layer 110 may be one or more of silicon dioxide ($SiO_2$), phosphosilicate glass (PSG), tetraethylorthosilicate (TEOS), borophosphosilicate glass (BPSG), or fluosilicate glass (FSG). In other examples, multiple sacrificial layers 110 and multiple supporting layers 120 may be sequentially formed at intervals to further enhance the structural strength of the memory capacitor.

At S20, the sacrificial layer 110 and the supporting layer 120 are etched to the surface of the substrate according to a capacitor hole 200 layout to form a capacitor hole 200.

With continued reference to FIG. 2, in the present example, capacitor holes 200 are formed in the supporting layer 120 and the sacrificial layer 110, and contact pads 101 in the substrate are exposed. Specifically, S20 may include the following operations. A third photoresist layer is formed on the surface of the supporting layer 120 through a blade coating or spin coating process; the third photoresist layer are exposed and developed according to the capacitor hole 200 layout to form a patterned third photoresist layer; the supporting layer 120 and the sacrificial layer 110 are etched to the surface of the substrate by taking the patterned third photoresist layer as a mask, so as to expose contact pads 101 in the substrate, and capacitor holes 200 are formed in the etched region; and the remaining third photoresist layer is removed by using a photoresist stripper.

At S30, a first electrode layer 400 is formed in the capacitor hole 200, and the first electrode layer 400 covers an inner wall of the capacitor hole 200 and the exposed substrate.

Figure 15:
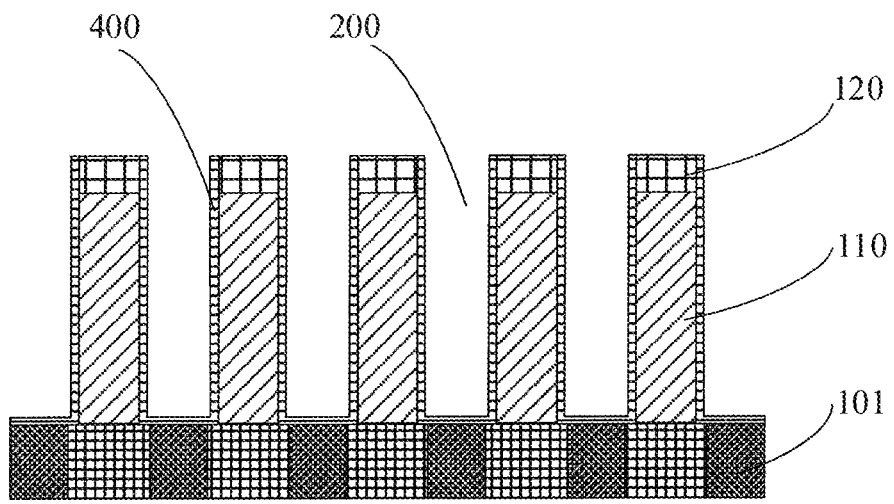
FIG. 15 is a schematic cross-sectional view of a device structure after S30 according to one or more examples.

FIG. 15 is a schematic cross-sectional view of a device structure after S30 in an example. As shown in FIG. 15, in the present example, the first electrode layer 400 covers the inner wall of the capacitor hole 200 and the exposed substrate. Specifically, S30 may include the following operations. A first metal layer is formed by using an ALD process, the first metal layer covers the surface of the supporting layer 120, the inner wall of the capacitor hole 200, and the exposed substrate. The first metal layer at the top of the supporting layer 120 is removed. The remaining first metal layer is taken as a first electrode layer 400. The first electrode layer 400 covers the inner wall of the capacitor hole 200 and the exposed substrate. Optionally, the material of the first electrode layer 400 is titanium nitride (TiN), and the first electrode layer 400 is connected to the contact pad 101 in the substrate for acquiring a signal from a transistor, thereby achieving storage and reading of data.

At S40, a capacitor opening hole 300 is formed by using the foregoing method for forming a capacitor opening hole, and the capacitor opening hole 300 is used to connect the multiple adjacent capacitor holes 200.

Figure 16:
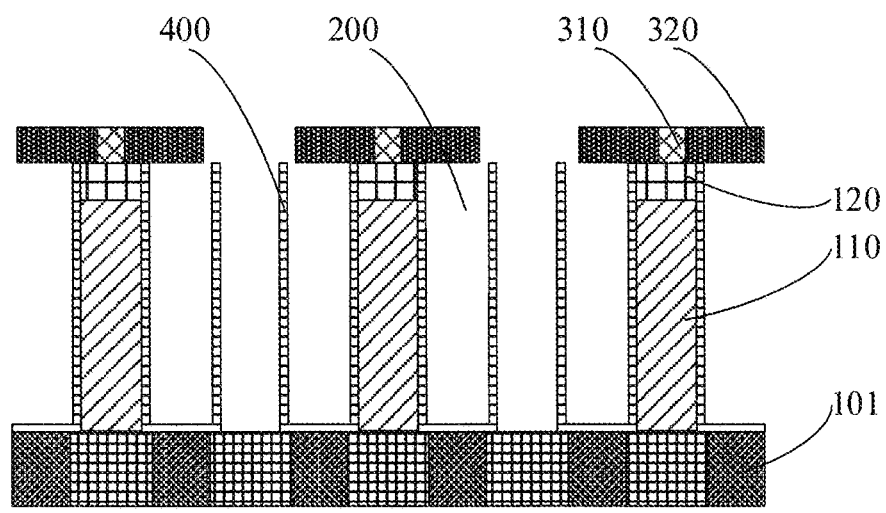
FIG. 16 is a schematic cross-sectional view of a device structure after S40 according to one or more examples.

FIG. 16 is a schematic cross-sectional view of a device structure after S40 according to an example. As shown in FIG. 16, in the present example, a first side wall structure 310 and a second side wall structure 320 are formed to expose a region where the capacitor opening hole 300 is to be formed, and then the sacrificial layer 110 and the supporting layer 120 are etched by taking the first side wall structure 310 and the second side wall structure 320 as masks to form the capacitor opening hole 300.

At S50, the remaining sacrificial layer 110 is etched through the capacitor opening hole 300.

Figure 17:
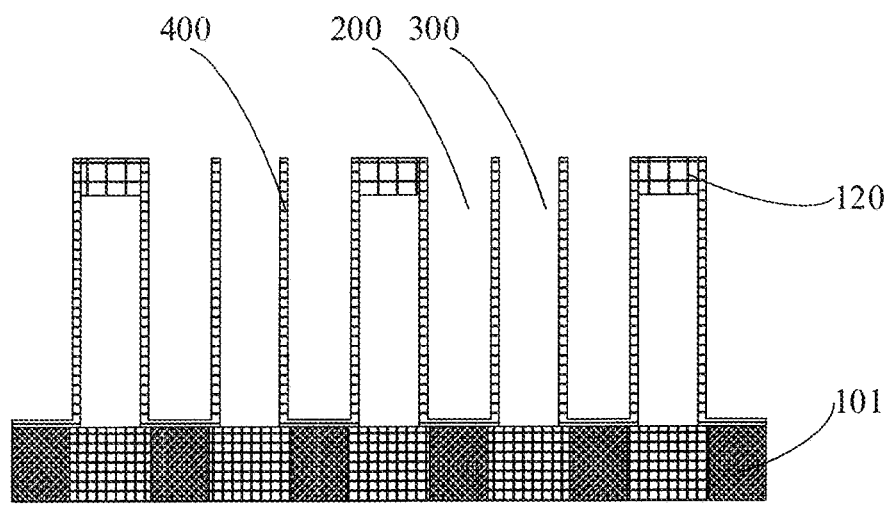
FIG. 17 is a schematic cross-sectional view of a device structure after S50 according to one or more examples.

FIG. 17 is a schematic cross-sectional view of a device structure after S50 according to an example. Specifically, in the present example, the remaining sacrificial layer 110 is removed by injecting a wet etching solution into the device through the capacitor opening hole 300. It should be noted that a corresponding wet etch solution may be selected according to the material of the sacrificial layer 110 to improve the efficiency of wet etching and to ensure that the sacrificial layer 110 is completely etched off.

At S60, a capacitor dielectric layer 500 and a second electrode layer 600 are sequentially formed on an inner wall of the capacitor opening hole 300 and the surface of the first electrode layer 400, and the first electrode layer 400, the capacitor dielectric layer 500 and the second electrode layer 600 jointly constitute a memory capacitor.

Figure 18:
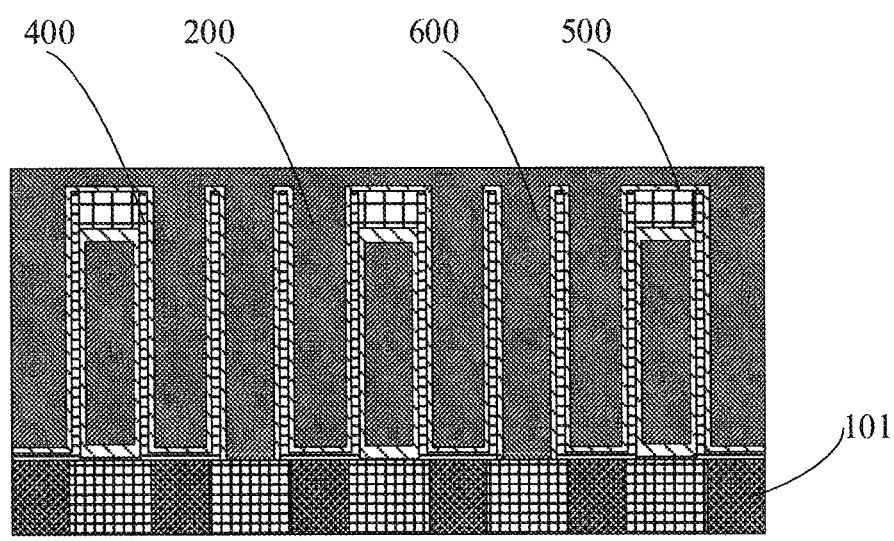
FIG. 18 is a schematic cross-sectional view of a device structure after S60 according to one or more examples.

FIG. 18 is a schematic cross-sectional view of a device structure after S60 in an example. As shown in FIG. 18, in the present example, the capacitor dielectric layer 500 covers the surface of the first electrode layer 400, and the second electrode layer 600 covers the surface of the capacitor dielectric layer 500. Optionally, the material of the capacitor dielectric layer 500 may be one or more of high dielectric constant materials such as hafnium oxide ($HfO_2$), hafnium orthosilicate ($HfSiO_4$), zirconium dioxide ($ZrO_2$), aluminum oxide ($Al_2O_3$), titanium dioxide ($TiO_2$), lanthanum oxide ($La_2O_3$), strontium titanate ($SrTiO_3$), lanthanum aluminate ($LaAlO_3$), cerium oxide ($CeO_2$), and yttrium oxide ($Y_2O_3$). By using the high dielectric constant material of the capacitor dielectric layer 500, the charge storage capacity of a capacitor can be effectively improved without increasing the size of the capacitor hole 200.

It should be understood that although the steps of the flowcharts are shown sequentially as indicated by the arrows, the steps are not necessarily performed sequentially as indicated by the arrows. Unless specifically stated otherwise herein, the steps are not performed in a strict order of limitation, and the steps may be performed in other orders. Moreover, at least a portion of the steps in the flowchart may include multiple steps or phases that are not necessarily performed at the same time, but may be performed at different times, and the steps or phases are not necessarily performed in sequence, but rather may be performed in turns or alternation with other steps or at least a portion of the steps or phases in the other steps.

In the descriptions of the present specification, the description with reference to the terms "some examples", "other examples", "ideal examples", etc. means that specific features, structures, materials, or features described in connection with an example or illustration are included in at least one example or illustration of the disclosure. In the present specification, the schematic description of the foregoing terms does not necessarily refer to the same example or illustration.

Various technical features in the foregoing examples may be randomly combined. For ease of simple description, not all possible combinations of various technical features in the foregoing examples are described. However, as long as the combinations of these technical features do not contradict, they should be regarded as falling within the scope of the present specification.

The foregoing examples represent only a few implementations of the disclosure, and the descriptions are specific and detailed, but should not be construed as limiting the patent scope of the disclosure. It should be noted that those of ordinary skill in the art may further make variations and improvements without departing from the conception of the disclosure, and these all fall within the protection scope of the disclosure. Therefore, the patent protection scope of the disclosure should be subject to the appended claims.

The invention claimed is:

1. A method for forming a capacitor opening hole, comprising:
providing a substrate, and forming a sacrificial layer and a supporting layer, which are stacked, on a surface of the substrate;
forming multiple hollow first side wall structures, spaced apart, on a surface of the supporting layer;
forming a second material layer on a surface of the multiple hollow first side wall structures to constitute a second side wall structure; and
etching the sacrificial layer and the supporting layer by taking the multiple hollow first side wall structures and the second side wall structure as masks to form the capacitor opening hole;
wherein the forming multiple hollow first side wall structures, spaced apart, on a surface of the supporting layer comprises:
forming multiple initial side wall structures, spaced apart, on the surface of the supporting layer, wherein the multiple initial side wall structures are columnar;
forming a first material layer on a sidewall of the multiple initial side wall structures; and
removing the multiple initial side wall structures, and taking a remaining portion of the first material layer as the multiple hollow first side wall structures.

2. The method of claim 1, wherein the forming multiple initial side wall structures, spaced apart, on the surface of the supporting layer comprises:
forming multiple first initial side walls on the surface of the supporting layer; and
forming multiple second initial side walls on the surface of the supporting layer,
wherein the multiple first initial side walls and the multiple second initial side walls have a same shape and are spaced apart from each other, and the multiple first initial side walls and the multiple second initial side walls jointly constitute the multiple initial side wall structures.

3. The method of claim 1, wherein the forming a first material layer on a sidewall of the multiple initial side wall structures comprises:
forming a nitride layer on the sidewall of the multiple initial side wall structures.

4. The method of claim 1, wherein each of the multiple initial side wall structures is a photoresist material, and the multiple initial side wall structures are formed by: forming a first photoresist layer on the surface of the supporting layer; exposing and developing the first photoresist layer through a photomask of the multiple initial side wall structures; and taking a remaining portion of the first photoresist layer as the multiple initial side wall structures.

5. The method of claim 1, wherein each of the multiple initial side wall structures is a silicon compound doped with elements comprising at least one of carbon, nitrogen or oxygen, and the multiple initial side wall structures are formed by: sequentially forming an initial side wall material layer and a second photoresist layer on the surface of the supporting layer;
exposing and developing the second photoresist layer through a photomask of the multiple initial side wall structures to form a patterned second photoresist layer, wherein the patterned second photoresist layer shields a region where the multiple initial side wall structures are to be formed; and etching the initial side wall material layer by taking the patterned second photoresist layer as a mask, and taking a remaining portion of the initial side wall material layer as the multiple initial side wall structures.

6. The method of claim 1, wherein a deposition thickness of the multiple hollow first side wall structures is changed by changing a deposition time of the first material layer.

7. The method of claim 1, wherein the forming a second material layer on a surface of the multiple hollow first side wall structures to constitute a second side wall structure comprises:
forming an oxide layer on the surface of the multiple hollow first side wall structures by adopting a growth process to constitute the second side wall structure.

8. The method of claim 1, wherein multiple capacitor holes are formed in the sacrificial layer and the supporting layer, and penetrate through the sacrificial layer and the supporting layer to the surface of the substrate in a vertical direction, six adjacent capacitor holes of the multiple capacitor holes are arranged in a horizontal plane in a shape of a regular hexagon, each vertex of the regular hexagon is provided with one capacitor hole of six adjacent capacitor holes, and a center of the regular hexagon is provided with another one capacitor hole of the multiple capacitor holes.

9. The method of claim 8, wherein the multiple hollow first side wall structures and the multiple capacitor holes are matched in size.

10. The method of claim 8, wherein the multiple capacitor holes are arranged in a Hexagonal Closest Packed (HCP) structure.

11. The method of claim 8, wherein an inner contour of the second side wall structure constitutes a first etching pattern, outer contours of three adjacent second side wall structures jointly constitute a second etching pattern, and the first etching pattern and the second etching pattern are in one-to-one correspondence with capacitor opening holes; and
each capacitor opening hole is used to connect three adjacent capacitor holes, and each capacitor hole is connected to only one capacitor opening hole.

12. The method of claim 1, wherein after the etching the sacrificial layer and the supporting layer by taking the multiple hollow first side wall structures and the second side wall structure as masks to form the capacitor opening hole, the method further comprises:
removing the multiple hollow first side wall structures and the second side wall structure.

13. The method of claim 1, wherein outer contours of two adjacent second side wall structures are tangent.

14. The method of claim 1, wherein multiple contact pads are formed in the substrate, and the multiple contact pads are regularly arranged in a horizontal plane, each of the multiple contact pads corresponds to one capacitor hole.

15. The method of claim 14, wherein an insulated layer is formed between adjacent contact pads of the multiple contact pads.

16. A method for forming a memory capacitor, comprising:
providing a substrate, and forming a sacrificial layer and a supporting layer, which are stacked, on a surface of the substrate;
etching the sacrificial layer and the supporting layer to the surface of the substrate according to a capacitor hole layout to form a capacitor hole;
forming a first electrode layer in the capacitor hole, the first electrode layer covering an inner wall of the capacitor hole and an exposed portion of the substrate;
forming multiple hollow first side wall structures, spaced apart, on a surface of the supporting layer;
forming a second material layer on a surface of the multiple hollow first side wall structures to constitute a second side wall structure;
etching the sacrificial layer and the supporting layer by taking the multiple hollow first side wall structures and the second side wall structure as masks to form a capacitor opening hole, the capacitor opening hole being used to connect multiple adjacent capacitor holes;
etching a remaining portion of the sacrificial layer through the capacitor opening hole; and
sequentially forming a capacitor dielectric layer and a second electrode layer on an inner wall of the capacitor opening hole and a surface of the first electrode layer, the first electrode layer, the capacitor dielectric layer, and the second electrode layer jointly constituting the memory capacitor;
wherein the etching the sacrificial layer and the supporting layer to the surface of the substrate according to a capacitor hole layout to form a capacitor hole further comprises:
forming a third photoresist layer on the surface of the supporting layer through a blade coating or spin coating process;
exposing and developing the third photoresist layer according to the capacitor hole layout to form a patterned third photoresist layer;
etching the supporting layer and the sacrificial layer to the surface of the substrate by taking the patterned third photoresist layer as a mask; and
removing the patterned third photoresist layer by using a photoresist stripper.

17. The method for forming a memory capacitor of claim 16, wherein the forming a first electrode layer in the capacitor hole, the first electrode layer covering an inner wall of the capacitor hole and an exposed portion of the substrate further comprises:
forming a first metal layer by using an atomic layer deposition process, wherein the first metal layer covers the surface of the supporting layer, the inner wall of the capacitor hole, and the exposed portion of the substrate; and
removing the first metal layer at top of the supporting layer, and taking a remaining portion of the first metal layer as the first electrode layer.

18. The method for forming a memory capacitor of claim 16, wherein a material of the capacitor dielectric layer is one or more of high dielectric constant materials.

19. A method for forming a capacitor opening hole, comprising:
providing a substrate, and forming a sacrificial layer and a supporting layer, which are stacked, on a surface of the substrate;
forming multiple hollow first side wall structures, spaced apart, on a surface of the supporting layer;
forming a second material layer on a surface of the first side wall structure to constitute a second side wall structure; and
etching the sacrificial layer and the supporting layer by taking the first side wall structure and the second side wall structure as masks to form the capacitor opening hole;
wherein the step of forming a second material layer on a surface of the first side wall structure to constitute a second side wall structure comprises:
forming an oxide layer on the surface of the first side wall structure by adopting a growth process to constitute the second side wall structure.

20. A method for forming a capacitor opening hole, comprising:
providing a substrate, and forming a sacrificial layer and a supporting layer, which are stacked, on a surface of the substrate;
forming multiple hollow first side wall structures, spaced apart, on a surface of the supporting layer;
forming a second material layer on a surface of the first side wall structure to constitute a second side wall structure; and
etching the sacrificial layer and the supporting layer by taking the first side wall structure and the second side wall structure as masks to form the capacitor opening hole;
wherein multiple capacitor holes are formed in the sacrificial layer and the supporting layer, and penetrate through the sacrificial layer and the supporting layer to the surface of the substrate in a vertical direction, six adjacent capacitor holes are arranged in a horizontal plane in a shape of a regular hexagon, each vertex of the regular hexagon is provided with one capacitor hole, and a center of the regular hexagon is provided with one capacitor hole;

wherein an inner contour of the second side wall structure constitutes a first etching pattern, outer contours of three adjacent second side wall structures jointly constitute a second etching pattern, and the first etching pattern and the second etching pattern are in one-to-one correspondence with the capacitor opening holes; and each capacitor opening hole is used to connect three adjacent capacitor holes, and each capacitor hole is connected to only one capacitor opening hole.

* * * * *